United States Patent
Tsai et al.

(10) Patent No.: US 11,415,273 B2
(45) Date of Patent: Aug. 16, 2022

(54) WAVELENGTH-CONVERTING DEVICE AND PROJECTION APPARATUS

(71) Applicant: Coretronic Corporation, Hsin-Chu (TW)

(72) Inventors: Chia-Lun Tsai, Hsin-Chu (TW); Chi-Tang Hsieh, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 50 days.

(21) Appl. No.: 16/662,043

(22) Filed: Oct. 24, 2019

(65) Prior Publication Data

US 2020/0132261 A1 Apr. 30, 2020

(30) Foreign Application Priority Data

Oct. 29, 2018 (CN) .......................... 201821757306.1

(51) Int. Cl.
| | |
|---|---|
| *F21K 9/64* | (2016.01) |
| *H01L 33/50* | (2010.01) |
| *G03B 21/20* | (2006.01) |
| *F21V 9/08* | (2018.01) |

(52) U.S. Cl.
CPC ............ *F21K 9/64* (2016.08); *F21V 9/08* (2013.01); *G03B 21/2006* (2013.01); *G03B 21/2066* (2013.01); *H01L 33/505* (2013.01); *H01L 33/508* (2013.01)

(58) Field of Classification Search
CPC . F21K 9/64; F21V 9/08; F21V 29/505; F21V 7/30; G03B 21/2006; G03B 21/2066; G03B 21/16; G03B 21/204; H01L 33/505; H01L 33/508
See application file for complete search history.

(56) References Cited

U.S. PATENT DOCUMENTS

| | | | | |
|---|---|---|---|---|
| 9,228,719 | B2 * | 1/2016 | Wang | ............ G03B 21/14 |
| 2015/0098070 | A1 * | 4/2015 | Hsieh | ............ G03B 21/204 |
| | | | | 359/326 |
| 2015/0362830 | A1 * | 12/2015 | Liao | ............ G03B 21/2066 |
| | | | | 353/31 |
| 2015/0381953 | A1 * | 12/2015 | Egawa | ............ H04N 9/3158 |
| | | | | 362/322 |

(Continued)

FOREIGN PATENT DOCUMENTS

| | | |
|---|---|---|
| CN | 203489181 U | 3/2014 |
| CN | 106195922 A | 12/2016 |

*Primary Examiner* — Shahed Ahmed
*Assistant Examiner* — Khatib A Rahman

(57) ABSTRACT

A wavelength-converting device has a light incident side. The wavelength-converting device includes an inner annular portion and an annular portion. The annular portion is connected to an outer edge of the inner annular portion. The annular portion includes a wavelength-converting portion, a first heat-conductive bonding medium, a reflective layer, and a wavelength-converting layer. A groove is annularly disposed in the wavelength-converting portion, and the groove is recessed from the light incident side of the wavelength-converting device. The first heat-conductive bonding medium is disposed in the groove. The reflective layer is disposed on the first heat-conductive bonding medium. The wavelength-converting layer is disposed on the reflective layer and has a light receiving surface. A projection apparatus is also provided.

24 Claims, 7 Drawing Sheets

(56) References Cited

U.S. PATENT DOCUMENTS

| | | | | |
|---|---|---|---|---|
| 2016/0004148 A1* | 1/2016 | Chiu | .................... | G03B 21/204 |
| | | | | 353/84 |
| 2016/0291315 A1* | 10/2016 | Hsu | ...................... | G03B 21/204 |
| 2016/0327851 A1* | 11/2016 | Liao | ................... | G03B 21/2066 |
| 2017/0038564 A1* | 2/2017 | Kuo | ....................... | G02B 13/18 |
| 2017/0059976 A1* | 3/2017 | Wang | .................. | H04N 9/3161 |
| 2017/0059979 A1* | 3/2017 | Hsu | ...................... | G02B 26/008 |
| 2017/0075203 A1* | 3/2017 | Cheng | ................. | H04N 9/3158 |
| 2017/0099467 A1* | 4/2017 | Egawa | .................. | G03B 21/16 |
| 2017/0127026 A1* | 5/2017 | Hsu | ...................... | G03B 21/204 |
| 2017/0163947 A1* | 6/2017 | Chang | ................. | G03B 21/204 |
| 2017/0176844 A1* | 6/2017 | Aoki | ................... | G03B 21/005 |
| 2017/0180686 A1* | 6/2017 | Chen | ................... | H04N 9/3114 |
| 2017/0244939 A1* | 8/2017 | Arakawa | .............. | H04N 9/3158 |
| 2017/0269464 A1* | 9/2017 | Tsai | ..................... | G02B 26/008 |
| 2018/0108814 A1* | 4/2018 | Zheng | .................. | H01S 5/0087 |
| 2018/0299110 A1* | 10/2018 | Asano | ................... | G03B 21/14 |
| 2019/0068936 A1* | 2/2019 | Takagi | ................ | G02B 27/141 |

\* cited by examiner

WAVELENGTH-CONVERTING DEVICE AND PROJECTION APPARATUS

CROSS-REFERENCE TO RELATED APPLICATION

THIS APPLICATION CLAIMS THE PRIORITY BENEFIT OF CHINA APPLICATION (CN201821757306.1 FILED ON 2018/10/29). THE ENTIRETY OF THE ABOVE-MENTIONED PATENT APPLICATION IS HEREBY INCORPORATED BY REFERENCE HEREIN AND MADE A PART OF THIS SPECIFICATION.

FIELD OF THE INVENTION

The invention relates to a projection apparatus, and more particularly to a wavelength-converting device and a projection apparatus using the same.

BACKGROUND OF THE INVENTION

With the market requirements for brightness, color saturation, service life, non-toxic environmental protection, etc of projection apparatus, the types of light sources used in the projection apparatus have evolved from UHP lamp, light emitting diode (LED) to laser diode (LD).

At present, the cost of high-brightness red laser diodes and green laser diodes is too high. In order to reduce the cost, a blue laser diode is used to excite the phosphor powder on the phosphor wheel to generate yellow wavelength light and/or green wavelength light. Optionally, the desired red light is filtered through a filter wheel and together with the blue light emitted by the blue laser diode to form the three primary colors of red, green, and blue required for the projected image. The phosphor wheel can be formed by a process such as attaching or sticking between structures or layers, and its thermal conductivity and reliability are the focus of those skilled in the art.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a wavelength-converting device and a projection apparatus. With the annular portion having a groove and the use of different forms, different positions, or different compositions of the heat-conductive bonding medium, the wavelength-converting device has improved thermal conductivity, thermal-conductive speed, and/or reliability.

Other objectives and advantages of the invention will be further understood from the technical features disclosed herein.

In order to achieve one or a part or all of the above or other objectives, the wavelength-converting device provided by the invention has a light incident side. The wavelength-converting device includes an inner annular portion and an annular portion. The annular portion is connected to an outer edge of the inner annular portion. The annular portion includes a wavelength-converting portion, a first heat-conductive bonding medium, a reflective layer, and a wavelength-converting layer. A groove is annularly disposed in the wavelength-converting portion, and the groove is recessed from the light incident side of the wavelength-converting device. The first heat-conductive bonding medium is disposed in the groove. The reflective layer is disposed on the first heat-conductive bonding medium. The wavelength-converting layer is disposed on the reflective layer and has a light receiving surface.

In order to achieve one or a part or all of the above or other objectives, the projection apparatus provided by the invention includes an illumination system, a light valve, and a projection lens. The illumination system is adapted to provide an illumination beam. The light valve is disposed on a transmission path of the illumination beam. The light valve is adapted to convert the illumination beam into an image beam. The projection lens is disposed on a transmission path of the image beam. The illumination system includes an exciting light source and the aforementioned wavelength-converting device. The exciting light source is adapted to provide an exciting beam. A wavelength-converting device is disposed on a transmission path of the exciting beam. The wavelength-converting layer of the wavelength-converting device is adapted to convert the exciting beam into a converted beam.

In summary, in the projection apparatus and the wavelength-converting device of the embodiment of the invention, the conversion efficiency of the wavelength-converting device can be improved by the arrangement of the wavelength-converting portion of the annular portion with the groove and/or the optical structure of the annular portion. The use of different forms, different positions, or different compositions of the heat-conductive bonding medium can effectively increase the bonding area between the wavelength-converting layer and the reflective layer and the heat conductive speed, thereby improving the heat conductivity and reliability of the wavelength-converting device. Thus, not only avoiding excessive heat to damage the wavelength conversion efficiency of the wavelength-converting layer and the reflection efficiency of the reflective layer, but also ensuring that the materials of the wavelength-converting layer and the reflective layer are not deteriorated or damaged by heat, thereby increasing the service life of the entire wavelength-converting device.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
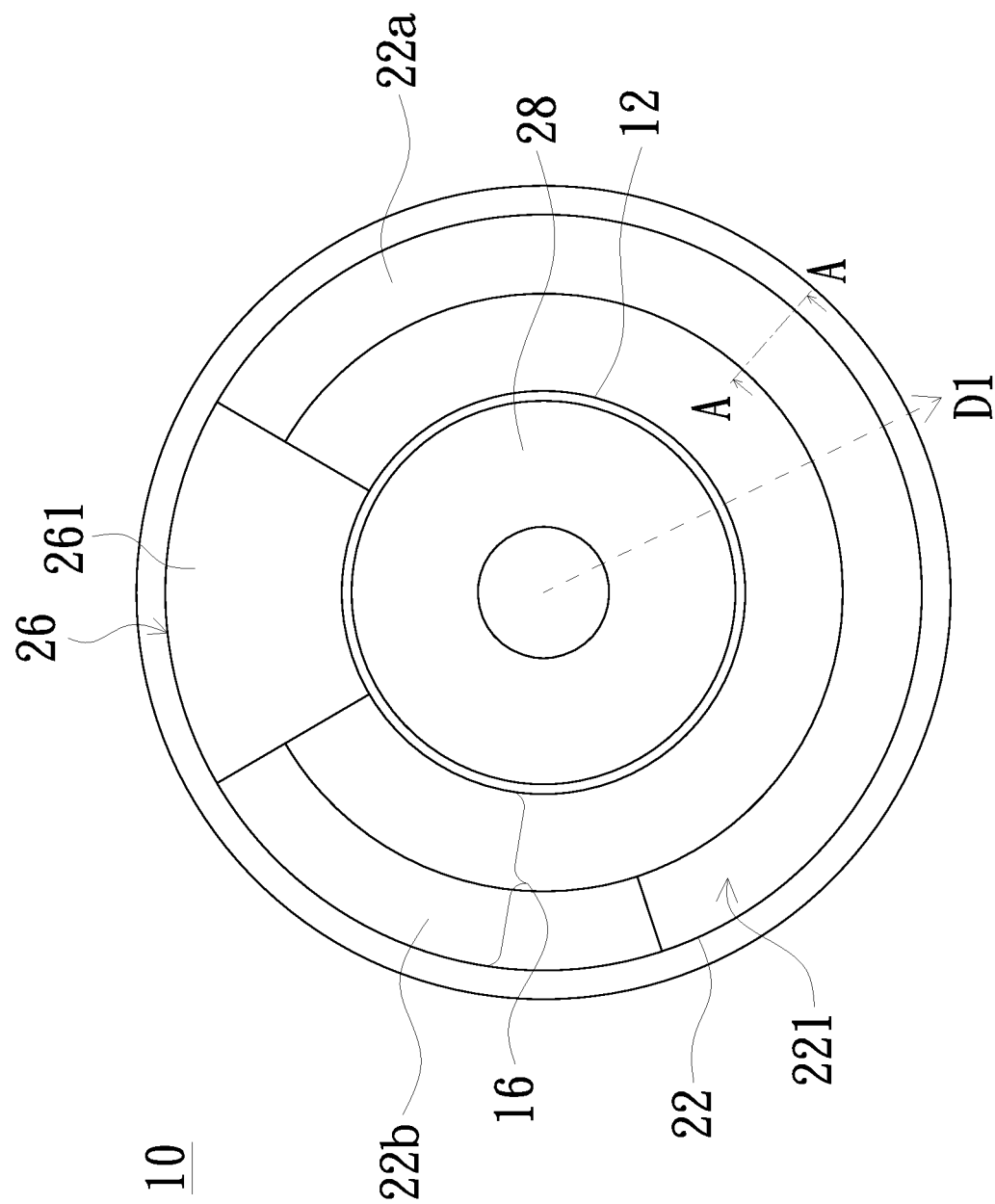
FIG. 1 is a schematic view of a wavelength-converting device according to an embodiment of the invention.
Figure 2:
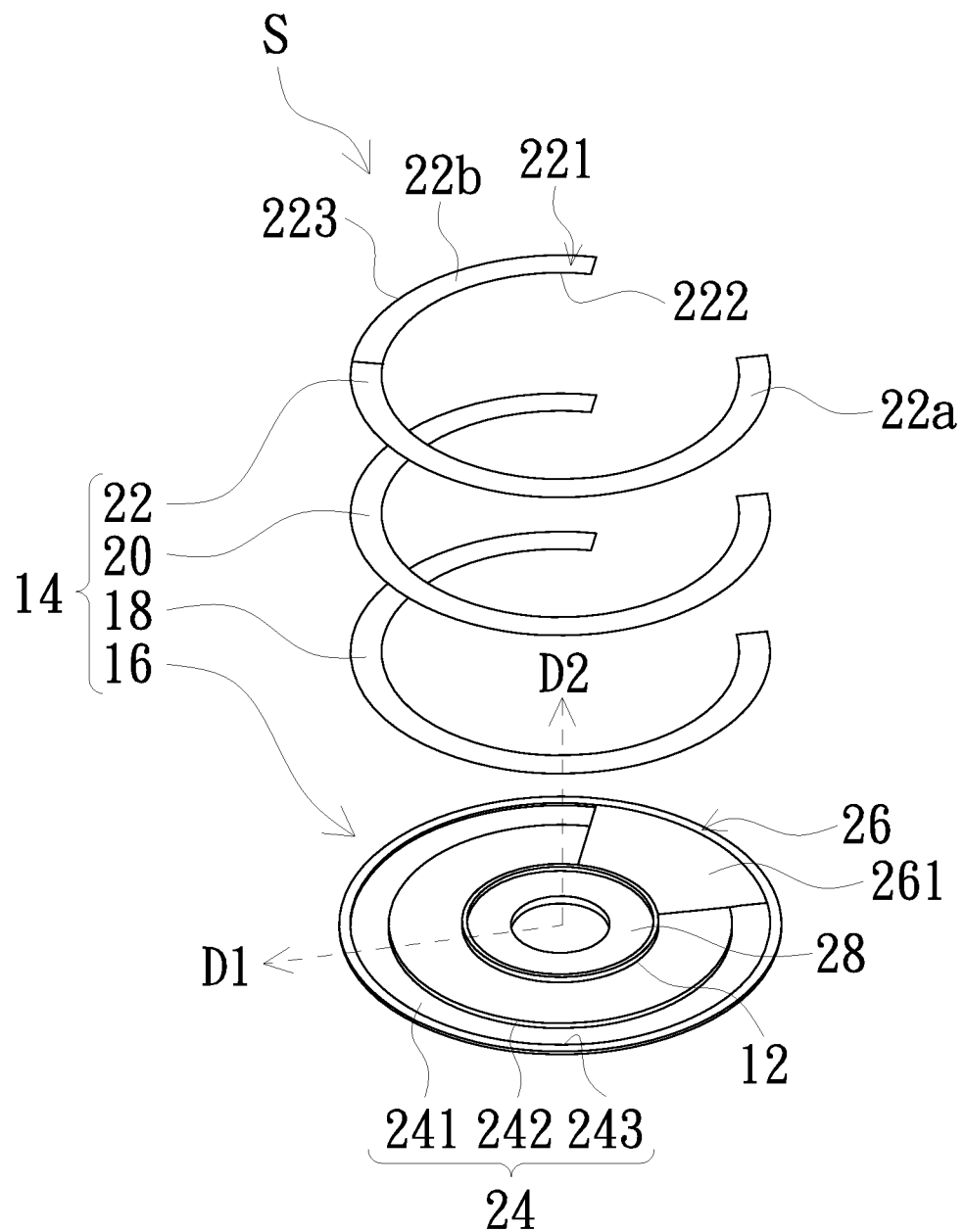
FIG. 2 is a schematic exploded view of FIG. 1.
Figure 3:
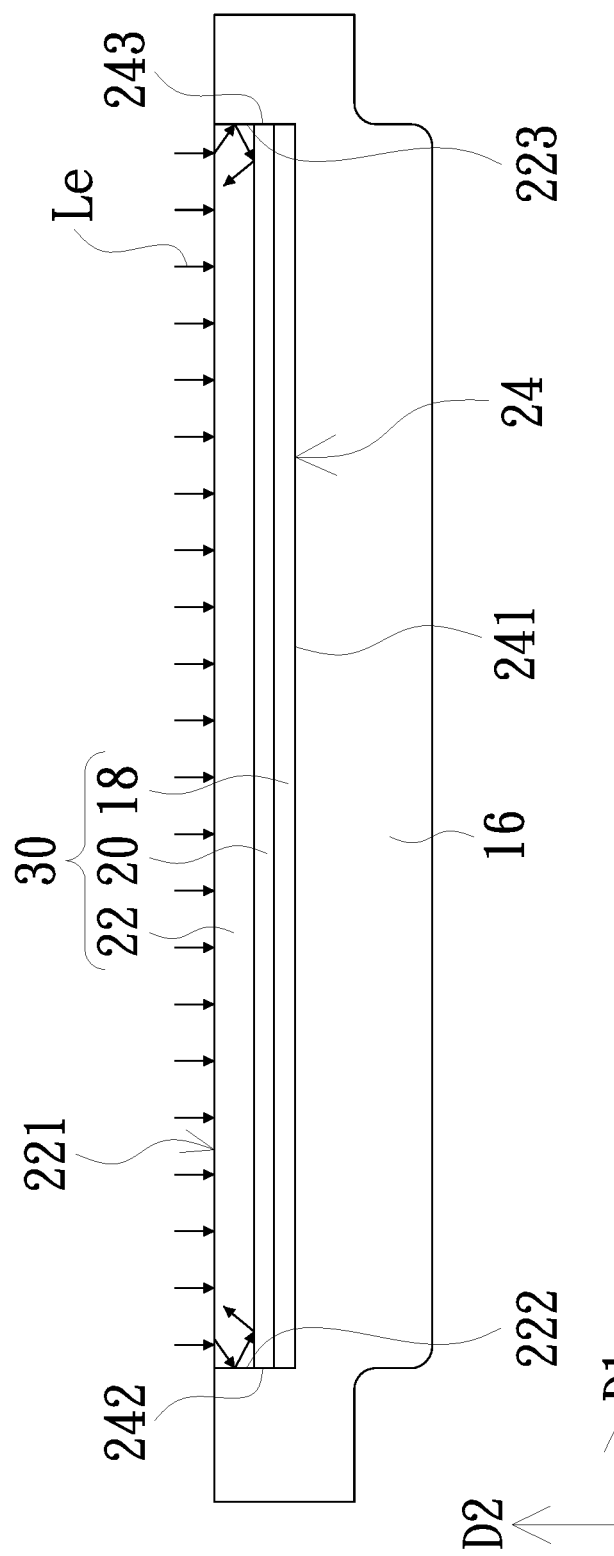
FIG. 3 is a cross-sectional view taken along line A-A of FIG. 1 according to the first embodiment of the invention.

FIG. 1 is a schematic view of a wavelength-converting device according to an embodiment of the invention. FIG. 2 is a schematic exploded view of FIG. 1. Referring to FIGS. 1 and 2, the wavelength-converting device 10 of the embodiment has a light incident side S. The wavelength-converting device 10 may have, for example, a circular dish shape and include an inner annular portion 12 and an annular portion 14. The annular portion 14 includes a wavelength-converting portion 16, a first heat-conductive bonding medium 18, a reflective layer 20, and a wavelength-converting layer 22. The annular portion 14 is connected to the inner annular portion 12 via the wavelength-converting portion 16. A groove 24 is formed on the wavelength-converting portion 16. The groove 24 is annularly disposed in the wavelength-converting portion 16 and is recessed from the light incident side S of the wavelength-converting device 10. The area of the groove 24 is defined as an area that is preset to be irritated by an exciting beam as the wavelength-converting portion 16 is rotated. In an embodiment, the groove 24 includes a bottom surface 241, an inner ring wall surface 242, and an outer ring wall surface 243. The inner ring wall surface 242 and the outer ring wall surface 243 are substantially perpendicular to the bottom surface 241. However, the invention is not limited thereto. In other embodiments, the inner ring wall surface 242 and the outer ring wall surface 243 may not be perpendicular to the bottom surface 241, due to the consideration of the practical feasibility. In the embodiment, it is defined that the bottom surface 241 extends in the radial direction D1, and the inner ring wall surface 242 and the outer ring wall surface 243 extend in the axial direction D2. FIG. 3 is a cross-sectional view taken along line A-A of FIG. 1 according to the first embodiment of the invention. As shown in FIG. 3, the first heat-conductive bonding medium 18 is disposed in the groove 24 of the wavelength-converting portion 16 in the radial direction D1 and its opposite direction. In an embodiment, the first heat-conductive bonding medium 18 may be disposed, for example, on the bottom surface 241 of the groove 24. The reflective layer 20 may be disposed on the first heat-conductive bonding medium 18, that is, the reflective layer 20 may be bonded to the groove 24 via the first heat-conductive bonding medium 18. The wavelength-converting layer 22 is disposed on the reflective layer 20 and has a light receiving surface 221. Please also refer to FIG. 2 at the same time. In an embodiment, the wavelength-converting layer 22 can be an annular layer body having a notch and have an inner ring edge 222 and an outer ring edge 223. The inner ring edge 222 and the outer ring edge 223 are substantially perpendicular to the light receiving surface 221. When the wavelength-converting layer 22 is disposed on the reflective layer 20 as shown in FIG. 3, the inner ring edge 222 is in contact with or adjacent to the inner ring side wall 242 of the groove 24, and the outer ring edge 223 is in contact with or adjacent to the outer ring side wall 243 of the groove 24.

The wavelength-converting portion 16 and the inner annular portion 12 are, for example, a metal material, a high temperature resistant material, a high heat conductivity material, and/or a material having good adhesion properties. The groove 24 can be manufactured by, for example, punching the wavelength-converting portion 16. However, the invention is not limited thereto. For example, in other embodiments, the groove 24 may also be formed by other molding processes such as casting.

The first heat-conductive bonding medium 18 can be a medium for improving heat conduction and/or reliability. The first heat-conductive bonding medium 18 can be selected from one of a heat-conductive patch and a heat-conductive paste. The thickness of the first heat-conductive bonding medium 18 is as thin as possible within a certain range, and preferably less than or equal to 0.15 mm. The thermal conductivity of the first heat-conductive bonding medium 18 is as high as possible within a certain range, and preferably greater than or equal to 1 (m·deg)/watt.

The material of the wavelength-converting layer 22 may be a phosphorescent material such as a fluorescent material or a phosphor or a nano material such as a quantum dot, but is not limited thereto. For example, the wavelength-converting layer 22 may be a phosphor layer. The phosphor layer may be made of Phosphor-in-Silicon (PiS), or may be fired from Phosphor-in-Glass (PiG), or may be fired from Phosphor-in-Ceramic (PiC). In the embodiment or other embodiments, the wavelength-converting layer 22 may also be a pure phosphor sheet. As shown in FIGS. 1 and 2, the wavelength-converting layer 22 can be divided into a plurality of regions 22a and 22b. The regions 22a and 22b are respectively provided with wavelength-converting materials of different compositions according to the optical engine design of different projection apparatuses to excite beam of different color wavelength, such as a yellow wavelength beam, a green wavelength beam.

For example, the reflective layer 20 may be formed by bonding white powders with a bonding material such as silica glue or inorganic glass glue. The white powder may be, for example, a single type of powder such as titanium dioxide, silicon dioxide, zirconium oxide, titanium aluminum alloy, various oxides, and the like, or a mixture of plurality types of powders. The inorganic glass glue may be a bonding material composed of a single type of adhesive such as phosphates, silicates, sulfates, borates, metal oxides, and the like, or a mixture of plurality types of adhesives and glues.

Following the above description, as shown in FIGS. 1 and 2, the annular portion 14 further includes an optical portion 26 adjacent to the wavelength-converting portion 16. The optical portion 26 can reflect the exciting beam or allow the exciting beam to pass therethrough. In an embodiment, the optical portion 26 includes an optical plate body 261 that may be, for example, a sector-shaped optical plate body extending to the inner annular portion 12. The optical plate body 261 may be a transmissive glass or a reflective glass. For example, the optical portion 26 reflects the exciting beam when the optical plate body 261 is a reflective glass; and the optical portion 26 allows the exciting beam to pass therethrough when the optical plate body 261 is a transmissive glass. In an embodiment, the optical plate body 261 is a transmissive glass, wherein the optical plate body 261 includes a glass substrate and an anti-reflection film, and the anti-reflection film is disposed on the glass substrate and faces the light incident side S.

In addition, as shown in FIGS. 1 and 2, the wavelength-converting device 10 further includes a motor (not shown) and a fixing ring 28. The motor has a rotating shaft, and the fixing ring 28 is sleeved on the rotating shaft, so that the inner annular portion 12 can rotate by the driving of the motor.

Following the above description, as shown in FIG. 3, the first heat-conductive bonding medium 18, the reflective layer 20, and the wavelength-converting layer 22 constitute a stacking structure 30. In an embodiment, a gap (not shown) may be formed between the stacking structure 30 and at least one of the inner ring wall surface 242 and the outer ring wall surface 243 of the groove 24. As such, the wavelength-converting layer 22 can be smoothly and easily placed into the groove 24.

In an embodiment, the overall material of the wavelength-converting portion 16 may be a metal mirror material, such as aluminum, so that the inner ring wall surface 242 and the outer ring wall surface 243 of the groove 24 have a specular reflection effect. As shown in FIG. 3, when the exciting beam Le from the light incident side S excites the material of the wavelength-converting layer 22 to generate scattered light in each direction, the scattered light can be reflected, by the specular reflection design of the inner ring wall surface 242 and the outer ring wall surface 243, back to the wavelength-converting layer 22 to increase the conversion efficiency of the wavelength-converting layer 22.

Figure 4:
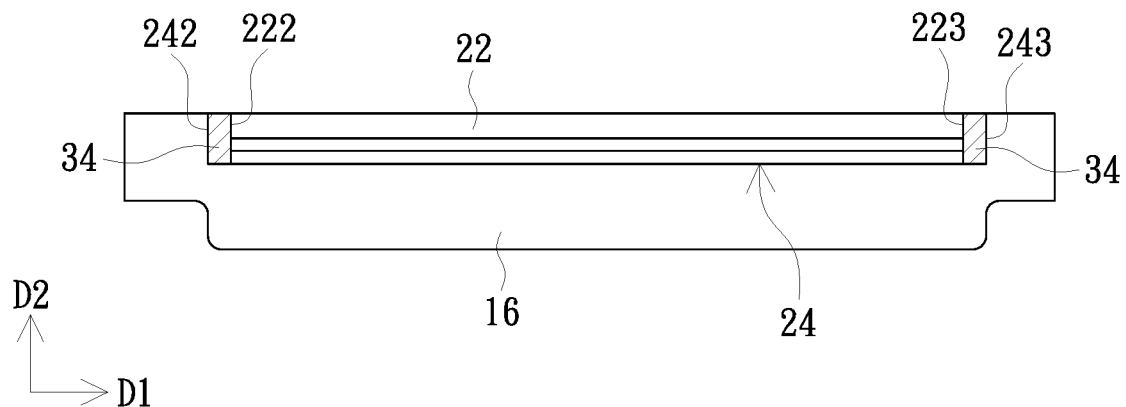
FIG. 4 is a cross-sectional view taken along line A-A of FIG. 1 according to the second embodiment of the invention.

In another embodiment, the wavelength-converting device 10 may further include an optical structure 34 regardless of whether the wavelength-converting portion 16 uses a mirror material, wherein the optical structure 34 is, for example, selected from one of a scattering layer and a reflective layer. FIG. 4 is a cross-sectional view taken along line A-A of FIG. 1 according to the second embodiment of the invention. As shown in FIG. 4, the optical structure 34 is disposed within a range of at least one of the inner ring wall surface 242 and the outer ring wall surface 243 of the groove 24, so that the optical structure 34 is located between at least one of the inner ring wall surface 242/outer ring wall surface 243 and the wavelength-converting layer 22. For example, the optical structure 34 may be coated on the entire outer ring wall surface 243 of the groove 24 or only on a portion of the outer ring wall surface 243, such as coated on the portion of the outer ring wall surface 243 adjacent to the outer ring edge 223 of the wavelength-converting layer 22. Similarly, the optical structure 34 may be simultaneously or selectively coated on the entire inner ring wall surface 242 of the groove 24 or only on a portion of the inner ring wall surface 242, such as coated on the portion of the inner ring wall surface 242 adjacent to the inner ring edge 222 of the wavelength-converting layer 22. Thus, by the reflection or scattering of the optical structure 34, the scattered light in each direction generated when the exciting beam Le (shown in FIG. 3) excites the material of the wavelength-converting layer 22 can be reflected back again to the wavelength-converting layer 22, thereby increasing the conversion efficiency of the wavelength-converting layer 22. Furthermore, since the optical structure 34 provided at least between the wavelength-converting layer 22 and the groove 24 in the axial direction D2 within a range of the inner ring wall surface 242/outer ring wall surface 243 replaces or adds to the simple air gap near the position, the wavelength-converting layer 22 can be at least partially in contact with the inner ring wall surface 242/outer ring wall surface 243 via the optical structure 34, thereby increasing the heat transfer area of the wavelength-converting layer 22. As such, the heat generated by the irradiation of the exciting beam Le on the wavelength conversion layer 22 can be quickly transferred to the wavelength-converting portion 16 via the optical structure 34 to perform heat dissipation, thereby improving heat dissipation efficiency.

Figure 5:
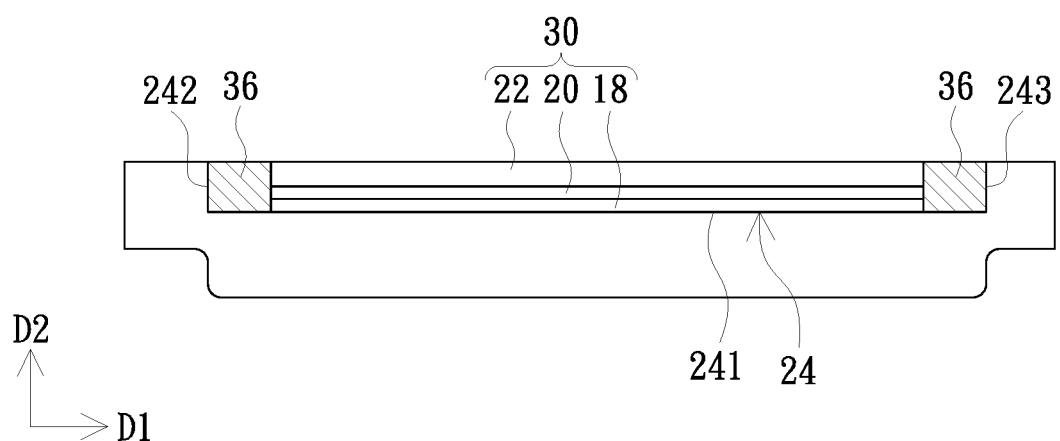
FIG. 5 is a cross-sectional view taken along line A-A of FIG. 1 according to the third embodiment of the invention.

In an embodiment, the wavelength-converting device 10 further includes a second heat-conductive bonding medium 36 disposed on at least one of the inner ring wall surface 242 and the outer ring wall surface 243 of the groove 24. For example, FIG. 5 is a cross-sectional view taken along line A-A of FIG. 1 according to the third embodiment of the invention. As shown in FIG. 5, the second heat-conductive bonding medium 36 is disposed within a range of the outer ring wall surface 243 and the inner ring wall surface 242, so as to be located between the outer ring wall surface 243/ inner ring wall surface 242 and the stacking structure 30. However, the invention is not limited thereto. In other unillustrated embodiments, the second heat-conductive bonding medium 36 may be selectively located only between the outer ring wall surface 243 and the stacking structure 30 or only between the inner ring wall surface 242 and the stacking structure 30. Or, the second heat-conductive bonding medium 36 may not be completely covered within a range of the inner ring wall surface 242 and/or the outer ring wall surface 243. For example, the second heat-conductive bonding medium 36 can be located only within a range of a portion of the inner ring wall surface 242 (e.g., between the inner ring wall surface 242 and the inner ring edge 222 of the wavelength-converting layer 22), and/or within a range of a portion of the outer ring wall surface 243 (e.g., between the outer ring wall surface 243 and the outer ring edge 223 of the wavelength-converting layer 22). In other embodiments, the second heat-conductive bonding medium 36 may also be located only partially between the inner ring wall surface 242 and the reflective layer 20 and/or partially between the outer ring wall surface 243 and the reflective layer 20. In still other embodiments, the second heat-conductive bonding medium 36 may be only partially located between the inner ring wall surface 242 and the first heat-conductive bonding medium 18, and/or partially located between the outer ring wall surface 243 and the first heat-conductive bonding medium 18.

Following the above description, the second heat-conductive bonding medium 36 can be, for example, a heat-conductive paste. Since the second heat-conductive bonding medium 36 can be disposed within a range of the inner ring wall surface 242/outer ring wall surface 243 in the axial direction D2, in addition the heat generated by the irridation of the exciting beam Le (shown in FIG. 3) on the wavelength-converting layer 22 and/or reflective layer 20 can be dissipated via the first heat-conductive bonding medium 18 disposed in the radial direction D1, the heat may also be dissipated simultaneously or additionally via the second heat-conductive bonding medium 36 disposed in the axial direction D2, thereby improving the heat conductive effect. In addition, since the second heat-conductive bonding medium 36 itself has an adhesive function, the arrangement of the second heat-conductive bonding medium 36 increases the bonding area between the stacking structure 30 and the inner ring wall surface 242/outer ring wall surface 243 of the groove 24 in the axial direction D2, thereby improving the reliability of the wavelength-converting device 10.

Figure 6:
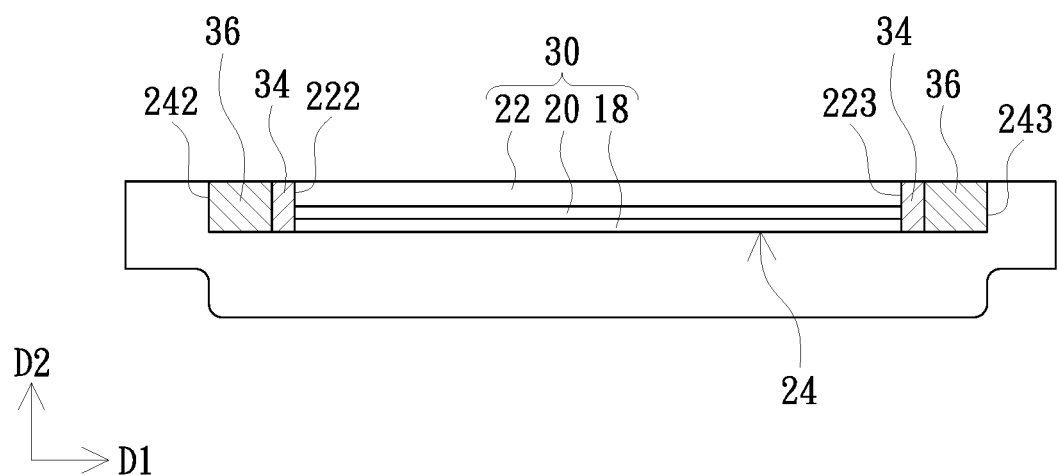
FIG. 6 is a cross-sectional view taken along line A-A of FIG. 1 according to the fourth embodiment of the invention.

Further, the wavelength-converting device 10 can be provided with the second heat-conductive bonding medium 36 and the optical structure 34 at the same time. For example, FIG. 6 is a cross-sectional view taken along line A-A of FIG. 1 according to the fourth embodiment of the invention. As shown in FIG. 6, the second heat-conductive bonding medium 36 is disposed within a range of the inner ring wall surface 242 and the outer ring wall surface 243 of the groove 24, and the optical structure 34 is disposed between the stacking structure 30 and the second heat-conductive bonding medium 36. However, the invention is not limited thereto. In other unillustrated embodiments, the optical structure 34 may be disposed only between inner ring edge 222/outer ring edge 223 of wavelength-converting layer 22 and the second heat-conductive bonding medium 36. Alternatively, when the second heat-conductive bonding medium 36 is disposed only within a range of the inner ring wall surface 242, the optical structure 34 is disposed between the inner ring edge 222 and the second heat-conductive bonding medium 36. When the second heat-conductive bonding medium 36 is disposed only within a range of the outer ring wall surface 243, the optical structure 34 is disposed between the outer ring edge 223 and the second heat-conductive bonding medium 36. Such the arrangement in which the second heat-conductive bonding medium 36 and the optical structure 34 exist at the same time can increase the conversion efficiency of the wavelength-converting layer 22 and the heat dissipation effect of the wavelength-converting layer 22.

Figure 7:
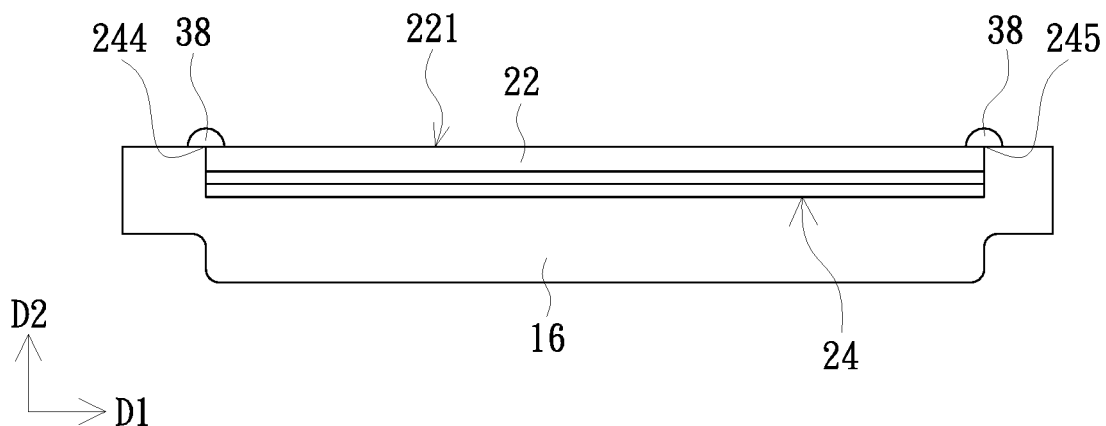
FIG. 7 is a cross-sectional view taken along line A-A of FIG. 1 according to the fifth embodiment of the invention.

FIG. 7 is a cross-sectional view taken along line A-A of FIG. 1 according to the fifth embodiment of the invention. The wavelength-converting device 10 further includes a third heat-conductive bonding medium 38. The groove 24 recessed in the wavelength-converting portion 16 has an inner ring edge 244 and an outer ring edge 245 on the light incident side S, and the third heat-conductive bonding medium 38 is coated on part or all of at least one of the inner ring edge 244 and the outer ring edge 245 of the groove 24, as such the cross section of the third heat-conductive bonding medium 38 in the radial direction D1 covers the edge of the light receiving surface 221 of the wavelength-converting layer 22 and the wavelength-converting portion 16. Further, selectively, the third heat-conductive bonding medium 38 may be coated on part or all of the edge of the light receiving surface 221 and the wavelength-converting portion 16 along the inner ring edge 244, or on part or all of the edge of the light receiving surface 221 and the wavelength-converting portion 16 along the outer ring edge 245.

Figure 8:
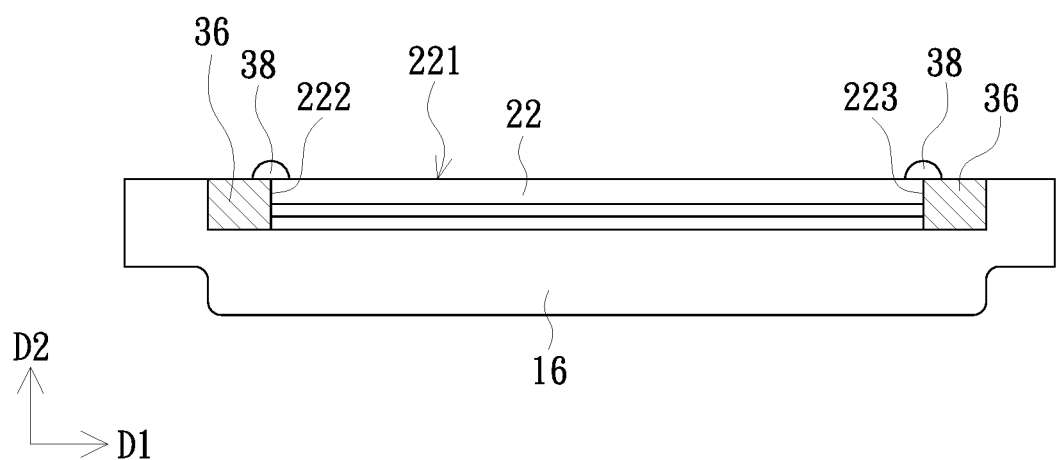
FIG. 8 is a cross-sectional view taken along line A-A of FIG. 1 according to the sixth embodiment of the invention.

In an embodiment, when the wavelength-converting device 10 has the second heat-conductive bonding medium 36 as shown in FIG. 8, the third heat-conductive bonding medium 38 is disposed at the edge of the light receiving surface 221 along the inner ring edge 222 and the outer ring edge 223 of the wavelength-converting layer 22 and at least covers the second heat-conductive bonding medium 36 (e.g., may also cover to the wavelength-converting portion 16). In this case, the third heat-conductive bonding medium 38 is distributed in a double ring shape on the light receiving surface 221. However, the invention is not limited thereto. In other embodiments, the third heat-conductive bonding medium 38 may be distributed in a single ring shape on the light receiving surface 221. For example, the third heat-conductive bonding medium 38 may be coated only at least at part or all of the edge of the light receiving surface 221 and the second heat-conductive bonding medium 36 along the inner ring edge 222 of the wavelength-converting layer 22 (e.g., may also cover to the wavelength-converting portion 16), or coated only at least at part or all of the edge of the light receiving surface 221 and the second heat-conductive bonding medium 36 along the outer ring edge 223 of the wavelength-converting layer 22 (e.g., may also cover to the wavelength-converting portion 16).

In addition, in other unillustrated embodiments, when the wavelength-converting device 10 is coated with the optical structure 34 but not coated with the second heat-conductive bonding medium 36, the third heat-conductive bonding medium 38 may also cover from the edge of the light receiving surface 221 of the wavelength-converting layer 22 to the optical structure 34.

The third heat-conductive bonding medium 38 can be, for example, a heat-conductive paste. The arrangement of the third heat-conductive bonding medium 38 further increase the heat conductive effect of the wavelength-converting layer 22, the bonding area between the wavelength-converting layer 22 and the wavelength-converting portion 16/second heat-conductive bonding medium 36/optical structure 24 and the reliability thereof.

Figure 9:
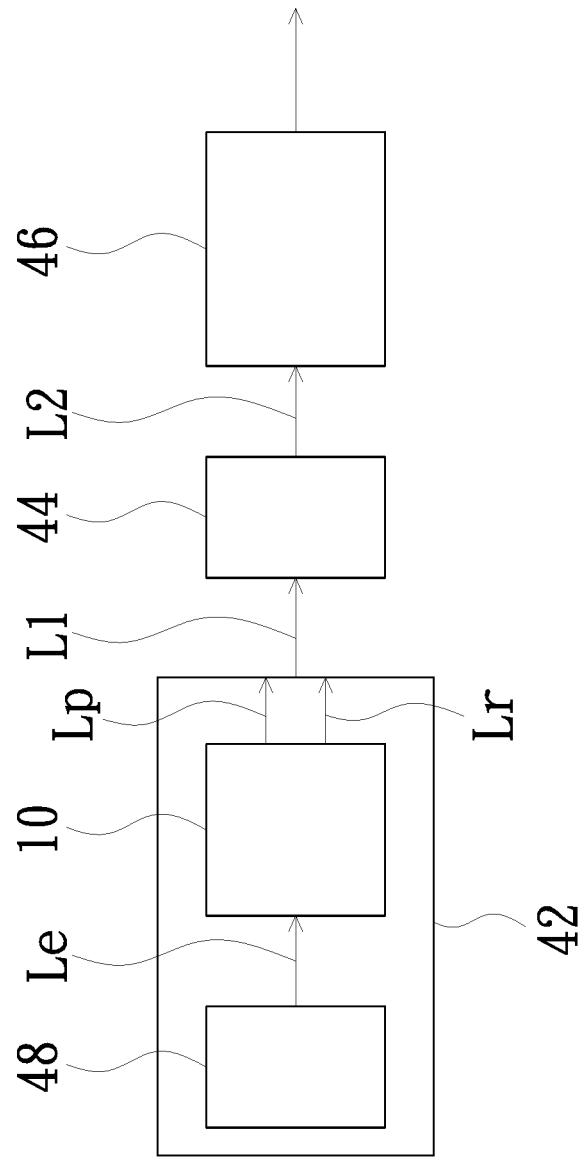
FIG. 9 is a block diagram of a projection apparatus according to an embodiment of the invention.

FIG. 9 is a block diagram of a projection apparatus according to an embodiment of the invention. Referring to FIG. 9, the projection apparatus 40 includes an illumination system 42, a light valve 44, and a projection lens 46. The illumination system 42 is for providing an illumination beam L1. In an embodiment, the illumination system 42 includes an exciting light source 48 and a wavelength-converting device 10. The exciting light source 48 is, for example, a diode module including a light emitting diode or a laser diode (LD) or a matrix composed of a plurality of diode modules for providing an exciting beam Le, but is not limited thereto. The wavelength-converting device 10 is disposed on the transmission path of the exciting beam Le.

The exciting beam Le is for illuminating the region of the groove 24 of the annular portion 14 (shown in FIG. 2) of the wavelength-converting device 10. The light receiving surface of the wavelength-converting layer 22 in the groove 24 receives the exciting beam Le as the wavelength-converting portion 16 rotates about the rotating shaft. The wavelength-converting layer 22 in the groove 24 is for converting the exciting beam Le into a converted beam Lp. The converted beam Lp is continuously reflected by the reflective layer 20. The wavelength of the converted beam Lp is different from the wavelength of the exciting beam Le. The exciting beam Le can pass through or be reflected by the optical portion 26 (shown in FIGS. 1 and 2). In FIG. 9, the exciting beam Le reflected by or passing through the optical portion 26 is indicated by Lr. The illumination beam L1 includes the converted beam Lp converted by the wavelength-converting layer 22 and the exciting beam Lr passing through the optical portion 26. The illumination beam L1 is composed of the converted beam Lp and the exciting beam Lr in time sequence.

The illumination system 42 may further include other optical components to transmit the illumination beam L1 to the light valve 44.

The light valve 44 is disposed on the transmission path of the illumination beam L1 to convert the illumination beam L1 into an image beam L2. The projection lens 46 is disposed on the transmission path of the image beam L2 to project the image beam L2 onto a screen, thereby forming an image frame on the screen. The light valve 44 may be a transmissive light valve or a reflective light valve. The transmissive light valve may be a transmissive liquid crystal panel, and the reflective light valve may be a digital micromirror device (DMD) or a liquid crystal on silicon (LCoS) panel, but is not limited thereto. The projection lens 46 may include, for example, a single or a combination of a plurality of optical lenses with diopter, such as including, for example, various combinations of non-planar lens such as a biconcave lens, a biconvex lens, a concave-convex lens, a convexo-concave lens, a plano-convex lens and a plano-concave lens. In an embodiment, the projection lens 46 may also include a plane optical lens. The invention does not limit the type and variety of the projection lens 46.

In summary, in the projection apparatus and the wavelength-converting device of the embodiment of the invention, the conversion efficiency of the wavelength-converting device can be improved by the arrangement of the wavelength-converting portion of the annular portion with the groove and/or the optical structure of the annular portion. The use of different forms, different positions, or different compositions of the heat-conductive bonding medium can effectively increase the bonding area between the wavelength-converting layer and the reflective layer and the heat conductive speed therebetween, thereby improving the heat conductivity and reliability of the wavelength-converting device. Thus, not only avoiding excessive heat to damage the wavelength conversion efficiency of the wavelength-converting layer and the reflection efficiency of the reflective layer, but also ensuring that the materials of the wavelength-converting layer and the reflective layer are not deteriorated or damaged by heat, thereby increasing the service life of the entire wavelength-converting device.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first heat-conductive bonding medium and the second heat-conductive bonding medium are only used for distinguishing various elements and do not limit the number of the elements.

What is claimed is:

1. A wavelength-converting device having a light incident side, and the wavelength-converting device comprising an inner annular portion and an annular portion, wherein:

the annular portion is connected to an outer edge of the inner annular portion, the annular portion comprises a wavelength-converting portion, a first heat-conductive bonding medium, a reflective layer, and a wavelength-converting layer, wherein:

a groove is annularly disposed in the wavelength-converting portion, and the groove is recessed from the light incident side of the wavelength-converting device;

the first heat-conductive bonding medium is disposed in the groove;

the reflective layer is disposed on the first heat-conductive bonding medium; and the wavelength-converting layer is disposed on the reflective layer and has a light receiving surface, wherein the groove comprises a bottom surface, an inner ring wall surface and an outer ring wall surface, the inner ring wall surface has a first end and a second end, and the outer ring wall surface has a third end and a fourth end, wherein the first end is adjacent to the light incident side relative to the second end, the third end is adjacent to the light incident side relative to the fourth end, and the second end and the fourth end are in contact with the bottom surface, and wherein a depth between the first end and the second end is substantially the same as a depth between the third end and the fourth end.

2. The wavelength-converting device according to claim 1, wherein the first heat-conductive bonding medium is disposed on the bottom surface.

3. The wavelength-converting device according to claim 2, further comprising an optical structure, wherein the optical structure is disposed within a range of at least one of the inner ring wall surface and the outer ring wall surface of the groove, so that the optical structure is located between the wavelength-converting layer and at least one of the inner ring wall surface and the outer ring wall surface.

4. The wavelength-converting device according to claim 3, wherein the optical structure is selected from one of a scattering layer and a reflective layer.

5. The wavelength-converting device according to claim 2, further comprising a second heat-conductive bonding medium, wherein the second heat-conductive bonding medium is disposed on at least one of the inner ring wall surface and the outer ring wall surface, so that the second heat-conductive bonding medium is located at least at one of: (1) between the wavelength-converting layer and at least one of the inner ring wall surface and the outer ring wall surface, (2) between the reflective layer and at least one of the inner ring wall surface and the outer ring wall surface, (3) between the first heat-conductive bonding medium and at least one of the inner ring wall surface and the outer ring wall surface.

6. The wavelength-converting device according to claim 5, further comprising an optical structure, wherein the wavelength-converting layer has an inner ring edge and an outer ring edge, the optical structure is disposed at least within a range of at least one of the inner ring wall surface and the outer ring wall surface of the groove, so that the optical structure is located at least at one of: (1) between the inner ring edge of the wavelength-converting layer and the inner ring wall of the groove, (2) between the inner ring edge of the wavelength-converting layer and the second heat-conductive bonding medium within the range of the inner ring wall surface, (3) between the outer ring edge of the wavelength-converting layer and the outer ring wall surface of the groove, (4) between the outer ring edge of the wavelength-converting layer and the second heat-conductive bonding medium within the range of the outer ring wall surface.

7. The wavelength-converting device according to claim 6, wherein the optical structure is a scattering layer or a reflective layer.

8. The wavelength-converting device according to claim 1, further comprising a third heat-conductive bonding medium, wherein the groove recessed in the wavelength-converting portion has an inner ring edge and an outer ring edge on the light incident side, the third heat-conductive bonding medium is coated along part or all of at least one of the inner ring edge and the outer ring edge of the groove, so that a radial section of the third heat-conductive bonding medium covers an edge of the light receiving surface of the wavelength-converting layer and the wavelength-converting portion.

9. The wavelength-converting device according to claim 2, wherein the first heat-conductive bonding medium, the reflective layer and the wavelength-converting layer constitute a stacking structure, and a gap is formed between the stacking structure and at least one of the inner ring wall surface and the outer ring wall surface of the groove.

10. The wavelength-converting device according to claim 1, wherein the annular portion further comprises an optical portion, the optical portion is adjacent to the wavelength-converting portion, and the optical portion comprises an optical plate body.

11. The wavelength-converting device according to claim 10, wherein the optical plate body is a transmissive glass or a reflective glass, the transmissive glass comprises a glass substrate and an anti-reflection film, and the anti-reflection film is disposed on the glass substrate and faces the light incident side.

12. The wavelength-converting device according to claim 1, further comprising a motor having a rotating shaft, wherein the inner annular portion of the wavelength-converting device surrounds the rotating shaft.

13. A projection apparatus, comprising: an illumination system, a light valve, and a projection lens, wherein the illumination system is adapted to provide an illumination beam, the light valve is disposed on a transmission path of the illumination beam and adapted to convert the illumination beam into an image beam, the projection lens is disposed on a transmission path of the image beam, and the illumination system comprises:
 an exciting light source, adapted to provide an exciting beam; and
 a wavelength-converting device, disposed on a transmission path of the exciting beam, a wavelength-converting layer of the wavelength-converting device is adapted to convert the exciting beam into a converted beam, wherein the wavelength-converting device has a light incident side and the wavelength-converting device comprises an inner annular portion and an annular portion, wherein:
 the annular portion is connected to an outer edge of the inner annular portion, the annular portion comprises a wavelength-converting portion, a first heat-conductive bonding medium, a reflective layer, and the wavelength-converting layer, wherein:
 a groove is annularly disposed in the wavelength-converting portion, and the groove is recessed from the light incident side of the wavelength-converting device;
 the first heat-conductive bonding medium is disposed in the groove;
 the reflective layer is disposed on the first heat-conductive bonding medium; and
 the wavelength-converting layer is disposed on the reflective layer and has a light receiving surface,
 wherein the groove comprises a bottom surface, an inner ring wall surface and an outer ring wall surface, the inner ring wall surface has a first end and a second end, and the outer ring wall surface has a third end and a fourth end, wherein the first end is adjacent to the light incident side relative to the second end, the third end is adjacent to the light incident side relative to the fourth end, and the second end and the fourth end are in contact with the bottom surface, and wherein a depth between the first end and the second end is substantially the same as a depth between the third end and the fourth end.

14. The projection apparatus according to claim 13, wherein the groove comprises a bottom surface, an inner ring wall surface and an outer ring wall surface, and the first heat-conductive bonding medium is disposed on the bottom surface.

15. The projection apparatus according to claim 14, further comprising an optical structure, wherein the optical structure is disposed within a range of at least one of the inner ring wall surface and the outer ring wall surface of the groove, so that the optical structure is located between the wavelength-converting layer and at least one of the inner ring wall surface and the outer ring wall surface.

16. The projection apparatus according to claim 15, wherein the optical structure is selected from one of a scattering layer and a reflective layer.

17. The projection apparatus according to claim 14, further comprising a second heat-conductive bonding medium, wherein the second heat-conductive bonding medium is disposed on at least one of the inner ring wall surface and the outer ring wall surface, so that the second heat-conductive bonding medium is located at least at one of: (1) between the wavelength-converting layer and at least one of the inner ring wall surface and the outer ring wall surface, (2) between the reflective layer and at least one of the inner ring wall surface and the outer ring wall surface, (3) between the first heat-conductive bonding medium and at least one of the inner ring wall surface and the outer ring wall surface.

18. The projection apparatus according to claim 17, further comprising an optical structure, wherein the wavelength-converting layer has an inner ring edge and an outer ring edge, the optical structure is disposed at least within a range of at least one of the inner ring wall surface and the outer ring wall surface of the groove, so that the optical structure is located at least at one of: (1) between the inner ring edge of the wavelength-converting layer and the inner ring wall of the groove, (2) between the inner ring edge of the wavelength-converting layer and the second heat-conductive bonding medium within the range of the inner ring wall surface, (3) between the outer ring edge of the wavelength-converting layer and the outer ring wall surface of the groove, (4) between the outer ring edge of the wavelength-converting layer and the second heat-conductive bonding medium within the range of the outer ring wall surface.

19. The projection apparatus according to claim 18, wherein the optical structure is a scattering layer or a reflective layer.

20. The projection apparatus according to claim 13, further comprising a third heat-conductive bonding medium, wherein the groove recessed in the wavelength-converting portion has an inner ring edge and an outer ring edge on the light incident side, the third heat-conductive bonding medium is coated along part or all of at least one of the inner ring edge and the outer ring edge of the groove, so that a radial section of the third heat-conductive bonding medium covers an edge of the light receiving surface of the wavelength-converting layer and the wavelength-converting portion.

21. The projection apparatus according to claim 14, wherein the first heat-conductive bonding medium, the reflective layer and the wavelength-converting layer constitute a stacking structure, and a gap is formed between the stacking structure and at least one of the inner ring wall surface and the outer ring wall surface of the groove.

22. The projection apparatus according to claim 13, wherein the annular portion further comprises an optical portion, the optical portion is adjacent to the wavelength-converting portion, and the optical portion comprises an optical plate body.

23. The projection apparatus according to claim 22, wherein the optical plate body is a transmissive glass or a reflective glass, the transmissive glass comprises a glass substrate and an anti-reflection film, and the anti-reflection film is disposed on the glass substrate and faces the light incident side.

24. The projection apparatus according to claim 13, further comprising a motor having a rotating shaft, wherein the inner annular portion of the wavelength-converting device surrounds the rotating shaft.

* * * * *